US005317105A

United States Patent [19]

Weber

[11] Patent Number: 5,317,105

[45] Date of Patent: May 31, 1994

[54] EMI/RFI GASKET APPARATUS

[75] Inventor: William F. Weber, Allen, Tex.

[73] Assignee: Alcatel Network Systems, Inc., Richardson, Tex.

[21] Appl. No.: 993,365

[22] Filed: Dec. 18, 1992

[51] Int. Cl.[5] .................... H05K 9/00; H01R 43/00; H01R 4/66; H01R 13/52

[52] U.S. Cl. .................... 174/35 GC; 429/95; 429/96; 429/108; 429/271; 429/927; 29/884

[58] Field of Search .................... 439/92, 95, 96, 101, 439/108, 271, 927; 174/35 GC, 35 R, 35 MS; 361/424; 29/592.1, 884

[56] References Cited

U.S. PATENT DOCUMENTS 2,783,295 2/1957 Ewing .................... 439/271
4,386,814 6/1983 Asick .................... 439/95
4,688,868 8/1987 Noyes .................... 439/108
4,767,345 8/1988 Gutter et al. .................... 439/92

*Primary Examiner*—Leo P. Picard
*Assistant Examiner*—Bot L. Ledynh
*Attorney, Agent, or Firm*—Bruce C. Lutz; Dennis O. Kraft

[57] ABSTRACT

An EMI/RFI gasket provides a barrier to EMI and RFI radiation transmission to and from electronic circuits within an electronic system chassis having receptacles that receive electrical connectors and an electrically grounded cover plate that connects the chassis to an electrical ground. The EMI/RFI gasket helps to provide a 360° EMI/RFI barrier for the electronic system chassis. The EMI/RFI gasket is a flexible, electrically-conductive material with sufficient surface area to adhere and electrically connect to the cover plate. The EMI/RFI gasket has a receiving slot that is symmetrical about a longitudinal axis and a latitudinal axis of the gasket plate. A plurality of deflected teeth formed from the gasket plate are positioned around the receiving slot and deflected from the gasket plate to contact the connector at points separated by not greater than a predetermined distance. The predetermined distance is at least in part a function of the expected EMI and RFI radiation wavelengths. This maintains an electrical ground connection between the cover plate and the connector.

6 Claims, 1 Drawing Sheet

FIG. 1
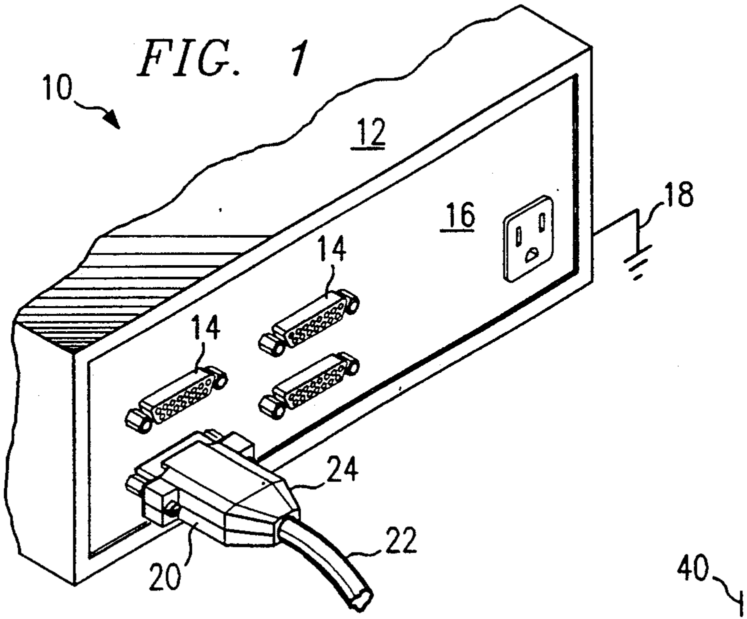
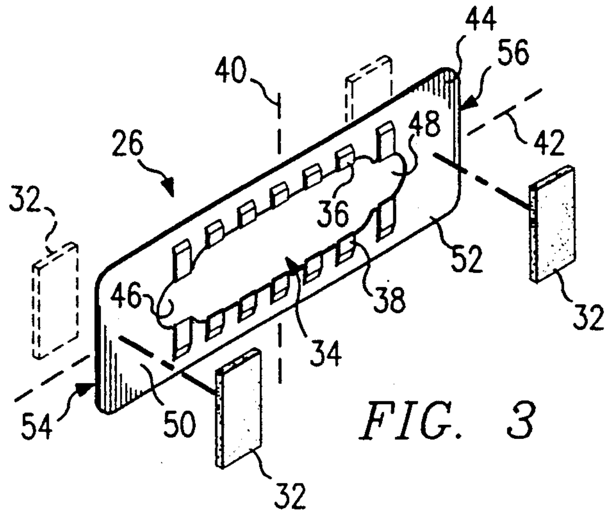
FIG. 3
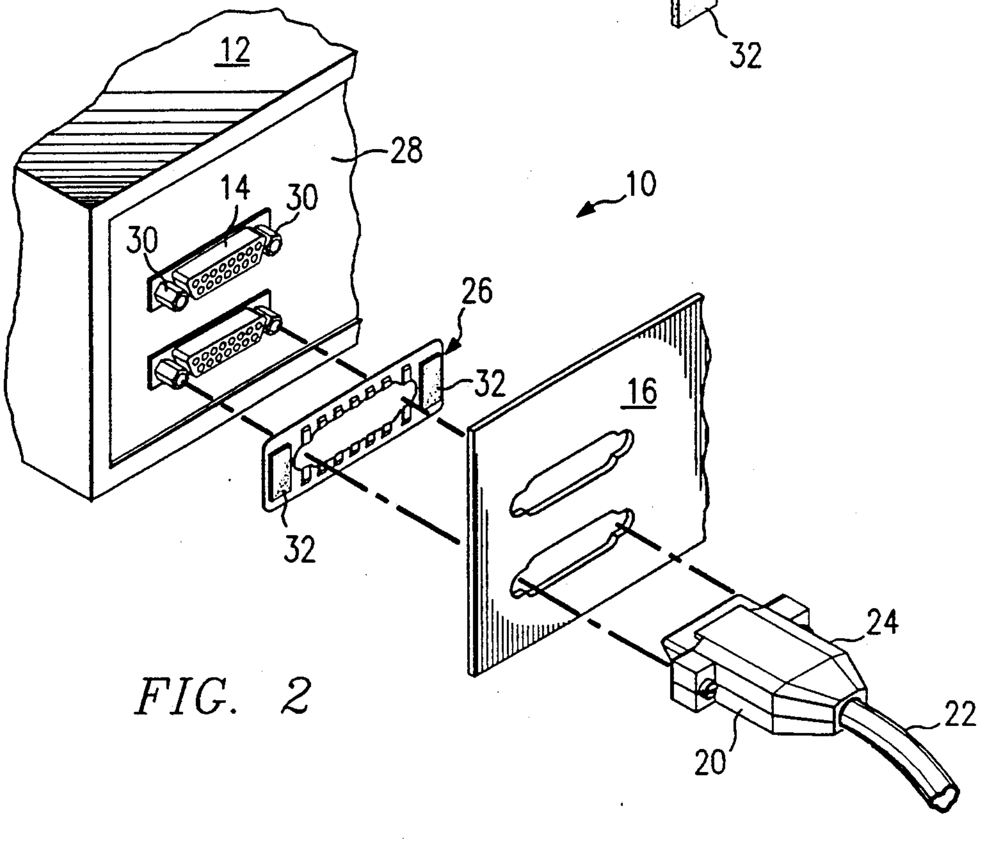
FIG. 2

EMI/RFI GASKET APPARATUS

TECHNICAL FIELD OF THE INVENTION

The present invention is related generally to electronics and, more specifically, to packaging of electronics to limit the communication of EMI (electromagnetic interference) and RFI (radiofrequency interference) signals. Even more specifically, the invention is related to providing a barrier to the transmission of EMI and RFI radiation to and from electronic circuits in an electronic system chassis by having an EMI/RFI gasket that electrically connects cable connectors through the electronic system chassis to an electrical ground and that is easy to install and maintain in operation.

BACKGROUND OF THE INVENTION

Prior art devices for grounding electrical chassis to prevent EMI radiation from leaving the chassis and RFI radiation from entering the chassis are complex to install and have limitations once installed. A particular point of concern in providing an EMI/RFI barrier to circuits within an electronic system chassis is EMI and RFI radiation leakage at receptacles that connect external cables to internal circuitry of the chassis. It is important that a ground exist at the receptacles for all EMI and RFI radiation that may be otherwise communicated through the chassis at the receptacle. One attempt to ensure that this undesirable radiation does not leak out of or into the chassis is to use an EMI/RFI gasket at the receptacle.

The prior art EMI/RFI gaskets, however, have significant limitations. First of all, prior art gaskets mimic the associated receptacle's shape. Many receptacles for electrical connectors have a "D"-shape that facilitates properly orienting the connector to the receptacle. These gaskets typically comprise small thin metal plates that fit over the receptacle to connect the receptacle to a cover plate that further connects to electrical ground. Unfortunately, gaskets that mimic this "D"-shape are difficult to install because they too must be oriented.

Another limitation of conventional EMI/RFI gaskets is that, while they fit the "D"-shaped gasket, they can not fit over all types of fastening points that permit fastening the connector to the receptacle. That is, receptacles typically include either screwholes or hexagonal posts to which fastening screws of the connectors attach. The existing EMI/RFI gaskets are designed to only fit the screwholes that are part of the receptacle. There is not an EMI/RFI gasket that accommodates both screwholes and hexagonal posts or many of the other various types of attachment or fastening points for fastening the connector to the receptacle.

A third important limitation associated with the prior art EMI/RFI gaskets has to do with their installation on the electronic system chassis. These gaskets typically fit on or over the receptacle beneath the cover plate. The gaskets are typically placed on the receptacle and are only held by means of gravity to the receptacle. Thus, upon removal of the cover plate, the gaskets may fall from the back cover of the chassis and down into or near other electronic devices or connections to the chassis or otherwise interfere with system maintenance or operation. This is an undesirable feature of the prior art EMI/RFI gaskets that, if avoided, could significantly simplify both their functioning, as well as overall maintenance of the associated electronic system.

It is an object of the present invention, therefore, to provide an improved EMI/RFI gasket that overcomes the limitations of prior art EMI/RFI gaskets. It is an object of the present invention to provide an EMI/RFI gasket that serves as a barrier to the transmission of EMI and RFI radiation to and from an electronic system chassis having an electrical receptacle for receiving an electrical connector and at least one fastening point for fastening the electrical connector to the receptacle. The chassis for which the EMI/RFI gasket has use has an electrically grounded cover plate to cover a predetermined portion of the chassis near the receptacle. The cover plate connects the chassis to an electrical ground. The EMI/RFI gasket of the present invention provides a gasket plate having a flat, flexible, electrically-conductive material with sufficient surface area to adhere and electrically connect to the cover plate, while maintaining flexibility sufficient to move upon the cover plate and gasket being placed over the receptacle. This promotes electrical contact among the receptacle, connector and the gasket plate. The receiving slot exists in the gasket plate for receiving the receptacle and permitting the use of a wide variety of fasteners associated with the connector. The receiving slot is symmetrical about a longitudinal axis and a latitudinal axis of the gasket plate. A plurality of deflected teeth are formed from the gasket plate and positioned around a predetermined portion of the receiving slot. The deflected teeth are deflected from the gasket plate to contact the connector at points separated by not greater than the predetermined distance that maintains an electrical ground connection between the cover plate and the connector. The predetermined distance is determined partially by estimated wavelengths of the EMI radiation and the RFI radiation.

It is also an object of the present invention to provide an EMI/RFI gasket that is easier to install for a wider variety of applications than prior art EMI/RFI gaskets.

It is a further object of the present invention to provide an improved EMI/RFI gasket that, once installed, permits removal of the chassis cover plate without the gaskets falling from their associated receptacles.

BRIEF DESCRIPTION OF THE DRAWINGS

Other objects and advantages of the present invention will be apparent from a reading of the specification and appended claims and, in conjunction with the drawings, wherein:

FIG. 1 provides an isometric view of an electronic system chassis that employs the preferred embodiment;

FIG. 2 shows an exploded view of the chassis of FIG. 1 to illustrate the installation of the EMI/RFI gasket of the preferred embodiment; and FIG. 3 illustrates an enlarged view of the EMI/RFI gasket of the preferred embodiment.

DETAILED DESCRIPTION OF THE INVENTION

In FIG. 1 appears a typical electronic system 10 that may employ the preferred embodiment of the present invention. Electronic system 10 has chassis 12 that contains electronic circuitry (not shown). Connecting to the electronic circuitry of electronic system 10 are various receptacles designated, for example, by reference numeral 14. Surrounding receptacle 14 is cover plate 16 that fastens by screws or another equally effective mechanism to chassis 12. As illustrated conceptually in FIG. 1, cover plate 16 connects to electrical ground as indicated by ground connection 18. Receptacle 14 is designed to receive connector 20 of cable 22. Cable 22 may connect to other electronic circuitry or to a power supply, for example. This assures that any EMI or RFI that contacts chassis 12 or cover plate 16 is grounded and, thereby, prevented from entering or exiting the circuitry of electronic system 10.

Although it may be the design that connector 20 and receptacle 14 form an EMI/RFI-tight connection, without the present invention, EMI and RFI radiation transmits or leaks through the space between connector 20 and receptacle 14 when they are joined together. This causes electronic system 10 to fail important FCC functional requirements and may adversely affect operation of electronic system 10.

FIG. 2 shows an exploded, isometric view of electronic system 10 to illustrate the use of EMI/RFI gasket 26. EMI/RFI gasket 26 fits over receptacle 14 between back panel 28 of chassis 12 and cover plate 16. FIG. 3 shows a more detailed isometric view of the preferred embodiment of the present invention. In particular, FIG. 3 shows EMI/RFI gasket 26 including receiving slot 34 and deflected teeth such as those indicated by reference numerals 36 and 38. Receiving slot 34 is symmetrical about longitudinal axis 40 and latitudinal axis 42 of gasket plate 44. Receiving slot 34 also includes extensions 46 and 48.

When placed over receptacle 14, EMI/RFI gasket 26 not only surrounds receptacle 14, but also surrounds fastening posts or holes designated by reference numeral 30 that permit fastening connector 20 to receptacle 14. That is, irrespective of whether fastening points 30 are hexagonal posts or screw holes that receive screws, EMI/RFI gasket 26 may be used. Prior art EMI/RFI gaskets simply have holes in the gasket to receive fasteners that attach to connector 20. These gasket holes accommodate positioning holes that are flush with the surface of receptacle 14 but not hexagonal posts that protrude from receptacle 14. Thus, the gasket holes that are typical for conventional EMI/RFI gasket devices do not permit placement of the conventional EMI/RFI gasket when receptacle 14 uses hexagonal posts. The preferred embodiment of EMI/RFI gasket 26, however, overcomes this problem by having extensions 46 and 48 of receiving slot 34 that, regardless of whether hexagonal posts or other types of extended fastening devices are used, accommodate easy engagement of EMI/RFI gasket 26 with receptacle 14.

Several important features are characteristic of receiving slot 34. One feature is that, as stated above, receiving slot 34 is symmetrical about longitudinal axis 40 and latitudinal axis 42. This permits easy orientation of EMI/RFI gasket 26 over both receptacle 14 and fastening posts or holes 30. Thus, whether EMI/RFI gasket 26 is rotated about longitudinal axis 40 or latitudinal axis 42 or both, EMI/RFI gasket 26 will properly fit over receptacle 14. This is significantly improved over the prior art devices that are shaped in the "D"-shape of receptacle 14. Although receptacle 14 is in a "D" shape, to properly orient connector 20 it is not necessary for EMI/RFI gasket 26 to also be in a "D"-shape. Symmetrical receiving slot 34 also achieves proper grounding between receptacle 14 and connector 20.

The preferred embodiment of the present invention includes deflected teeth 36 and 38. Deflected teeth 36 and 38 are formed from gasket plate material 44 by cutting or otherwise separating portions of gasket plate material 44 to extend outward from EMI/RFI gasket 26. EMI/RFI gasket 26 is a flat, flexible, electrically-conductive material. Therefore, deflected teeth 36 and 38 extend from the flat gasket plate material 44 to ensure contact between EMI/RFI gasket 26 and connector 20. This ensures that an electrical connection to ground exists for connector 20 at the points where deflected teeth 36 and 38 contact cover plate 16 or receptacle 14.

The spacing of deflected teeth 36 and 38 is determined, at least in part, by the expected EMI radiation and RFI radiation for which EMI/RFI gasket 26 is to serve as a barrier. The spacing between teeth 36 and 38 may be as small as desired, but the maximum width of or spacing between deflected teeth 36 and 38 is limited by the expected EMI wavelength and RFI wavelength. In the preferred embodiment, the spacing is approximately one hundredth of a wavelength. This ensures that the contact points for EMI/RFI gasket 26 to connector 20 serve as an effective barrier for the suspect radiofrequency interference.

An important aspect of EMI/RFI gasket 26 of the preferred embodiment is that it includes a double-sided adhesive tape such as that indicated by reference numeral 32 to adhere EMI/RFI gasket 26 to cover plate 16. Once EMI/RFI gasket 26 adheres to cover plate 16, cover plate 16 may be removed without concern for EMI/RFI gasket 26 falling from receptacle 14. Double-sided tape pieces designated by reference numeral 32 may adhere to positions 50 and 52 of EMI/RFI gasket 26. When placed at positions 50 and 52, EMI/RFI gasket 26 may be first placed over receptacle 14 so that the sticky side of adhesive double-sided tape 32 is exposed. Then, cover plate 16 may be placed over EMI/RFI gasket 26 and chassis back panel 28. This registers the position of EMI/RFI gasket 26 with the associated receptacle 14 and, at the same time, adheres EMI/RFI gasket 26 to cover plate 16. Once registered and adhered, cover plate 16 may be easily removed (assuming connector 20 is disengaged) without EMI/RFI gasket falling or separating from receptacle 14.

It is not possible with conventional EMI/RFI gasket devices to use the adhesive as is done in the EMI/RFI gasket 26 of the preferred embodiment. This is because conventional EMI/RFI gasket devices are not designed with sufficient flexibility and surface area to both adhere to back cover 18 and be responsive to the pressure arising when connector 20 engages and fastens to receptacle 14. The preferred embodiment also has the advantage, due to its both latitudinal and longitudinal symmetry to be fabricated with adhesive double-sided tape on either side of gasket plate material 44. That is, at both positions 50 and 52 of gasket plate 44 adhesive double-sided tape 32 may be adhered. Also, on a reverse side 54 and 56 may be placed another set adhesive double-sided tape pieces 32. Then, upon being placed over receptacle 14, the protective layer that covers the sticky side of adhesive double-sided tape may be removed to properly adhere EMI/RFI gasket 26 to the inside portion of cover plate 16. Due to their lack of symmetry, conventional EMI/RFI gasket devices cannot be installed in this easy way.

Yet another technical advantage of the EMI/RFI gasket of the preferred embodiment is its ability to be machine-installed on receptacle 14. Because of its symmetry, EMI/RFI gasket 26 may be installed simply by being placed on receptacle 14 without regard to orientation. The symmetry of EMI/RFI gasket makes it possible for a simple automated machine to place EMI/RFI gasket 26 over receptacle 14 without regard to it orientation.

The preferred embodiment may be formed by using a beryllium copper alloy such as berylco alloy 172 of the thickness of approximately 0.01 inches. This form has the height of 0.78 inches and width of 2.50 inches for gasket plate material 44. The size of gasket plate material 44, however, depends on the size of receptacle 14 of the particular application. For example, for a typical 15-position D-connector, receiving slot 34 has a height of approximately of 0.40 inches and a side-to-side width between extensions 46 and 48 of approximately 1.60 inches. To ensure receiving hole 46 and 48 cover a wide variety of fastening posts, their diameter should be approximately 0.25 inches. Deflected teeth such as teeth 36 and 38 are bent up from gasket plate material 44 and have a width at the edge of receiving slot 34 of approximately 0.10 inches. For finishing, EMI/RFI gasket 26 of the preferred embodiment is heat treated for two hours at temperature of 600° F. and tin plated.

OPERATION

The basic operation of the preferred embodiment is very straight forward once conceived and comprises placing EMI/RFI gasket 26 over receptacle 14 and fastening points 30 for initial installation. Then, in the preferred embodiment, the protective film on double-sided adhesive tape 32 is removed and cover plate 16 is placed over EMI/RFI gasket 26, as well receptacles 14 and chassis back portion 28. Once in place, EMI/RFI gasket 26 maintains EMI radiation within chassis 12 and keeps RFI radiation from interfering with the operation of electronic circuitry within chassis 12. Once installed, EMI/RFI leakage at the connection between receptacle 14 and connector 20 is controlled for all types of operation of electronic system 10.

In summary, we have illustrated one embodiment of the inventive concept of an EMI/RFI gasket to provide a barrier that prevents EMI and RFI radiation transmission to and from an electronic system chassis, where the chassis has an electrical receptacle that receives an electrical connector and that has at least one of a wide variety of fastening points for fastening the electrical connector to the receptacle; the chassis further having an electrically-grounded cover plate for covering a predetermined portion of the chassis near the receptacle and connecting the chassis to an electrical ground, and further where the EMI/RFI gasket includes a gasket plate having a flat, flexible, electrically-conductive material that has sufficient area for adhering and electrically connecting to the cover plate while maintaining flexibility sufficient to move upon being placed over the receptacle in order to promote electrical contact among the receptacle, the connector, cover plate, and the gasket plate, and further where the EMI/RFI gasket includes a receiving slot within the gasket plate to receive the receptacle and to permit fastening the connector to the receptacle, regardless of the type of fastening point (e.g., whether the fastening point is a flush screwhole or hexagonal post) and where the receiving slot is symmetrical about a longitudinal axis and a latitudinal axis of the gasket plate, and further where the EMI/RFI gasket includes a plurality of deflected teeth formed from the gasket plate and positioned around a predetermined portion of the receiving slot, the plurality of deflected teeth being deflected from the gasket plate for connecting the connector at points separated by not greater than a predetermined distance to maintain an electrical ground connection between the cover plate and the connector, and where the predetermined distance is determined, at least in part, by the estimated wavelengths of the EMI radiation and the RFI radiation.

As a result of the above, although the invention has been described with reference to the above embodiment, its description is not meant to be construed in a limiting sense. Various modifications of the disclosed embodiment, as well as alternative embodiments of the invention will become apparent to persons skilled in the art upon reference to the above description. It is, therefore, contemplated that the appended claims will cover such modifications that fall within the true scope of the invention.

What is claimed is:

1. An EMI/RFI gasket for providing a barrier for EMI and RFI radiation transmission to and from an electronic system chassis, said chassis having a receptacle, said receptacle for receiving an electrical connector and having at least one of a variety of fastener points for fastening said electrical connector to said receptacle, said chassis further having an electrically-grounded cover plate for covering a predetermined portion of said chassis near said receptacle and connecting said chassis to an electrical ground, said EMI/RFI gasket comprising:

a gasket plate comprising a flat, flexible, electrically-conductive material having sufficient flexibility and surface area for adhering and electrically connecting to said cover plate while maintaining flexibility sufficient to move upon being placed over said receptacle and, thereby, promoting electrical contact among said receptacle, said connector, said cover plate, and said gasket plate;

a receiving slot within said gasket plate for receiving said receptacle and associating with said fastening point, said receiving slot being symmetrical about a longitudinal axis and a latitudinal axis of said gasket plate; and a plurality of deflected teeth formed from said gasket plate and positioned around a predetermined portion of said receiving slot, said plurality of deflected teeth being deflected from said gasket plate for contacting said connector at points separated by not greater than a predetermined distance to maintain an electrical ground connection between said cover plate and said connector, said predetermined distance being determined partially by estimated wavelengths of said EMI radiation and said RFI radiation.

2. A method for inhibiting EMI and RFI radiation transmission to and from an electronic system chassis, said chassis having a receptacle, said receptacle for receiving an electrical connector and having at least one of a variety of fastener points for fastening said electrical connector to said receptacle, said chassis further having an electrically grounded cover plate for covering a predetermined portion of said chassis near said receptacle and connecting said chassis to an electrical ground, said method comprising the steps of:

adhering and electrically connecting a gasket plate comprising a flat, flexible, electrically-conductive material to said cover plate, said gasket plate having sufficient surface area and flexibility to move upon being placed over said receptacle to promote electrical contact among said receptacle, said connector, and said gasket plate;

receiving said receptacle through and engaging said fastener point with a receiving slot within said gasket plate, said receiving slot being symmetrical about a longitudinal axis and a latitudinal axis of said gasket plate; and contacting said connector at points separated by not greater than a predetermined distance to maintain an electrical ground connection between said cover plate and said connector using a plurality of deflected teeth formed from said gasket plate and positioned around a predetermined portion of said receiving slot, said plurality of deflected teeth being deflected from said gasket plate, said predetermined distance being determined partially by estimated wavelengths of said EMI radiation and said RFI radiation.

3. An EMI/RFI gasket for providing a barrier to EMI and RFI radiation transmission to and from an electronic system chassis, said chassis having a receptacle for receiving an electrical connector, said chassis further having an electrically-grounded cover plate for covering a predetermined portion of said chassis near said receptacle and connecting said chassis to an electrical ground, said EMI/RFI gasket comprising:

a gasket plate comprising an electrically-conductive material for electrically connecting to said cover plate and promoting electrical contact among said receptacle, said connector, and said gasket plate;

a receiving slot within said gasket plate for receiving said receptacle, said receiving slot being symmetrical about a longitudinal axis and a latitudinal axis of said gasket plate; and a plurality of deflected teeth formed from said gasket plate and positioned around a predetermined portion of said receiving slot, said plurality of deflected teeth being deflected from said gasket plate for contacting said connector at points separated by not greater than a predetermined distance to maintain an electrical ground connection between said cover plate and said connector, said predetermined distance being determined partially by an estimated wavelength of said radiation.

4. A method for preventing EMI radiation from leaving and entering an electronic system chassis, said chassis having a receptacle for receiving an electrical connector, said chassis further having an electrically-grounded cover plate for covering a predetermined portion of said chassis near said receptacle and connecting said chassis to an electrical ground, said method comprising the steps of:

electrically connecting a gasket plate comprising an electrically-conductive material to said cover plate to promote electrical contact among said receptacle, said connector, and said gasket plate;

receiving said receptacle through a receiving slot within said gasket plate, said receiving slot being symmetrical about a longitudinal axis and a latitudinal axis of said gasket plate; and contacting said connector at points separated by not greater than a predetermined distance to maintain an electrical ground connection between said cover plate and said connector by using a plurality of deflected teeth formed from said gasket plate and positioned around a predetermined portion of said receiving slot, said plurality of deflected teeth being deflected from said gasket plate, said predetermined distance being determined partially by an estimated wavelength of said RFI radiation.

5. An EMI/RFI gasket for providing a barrier for EMI and RFI radiation transmission to and from an electronic system chassis, said chassis having a receptacle, said receptacle for receiving an electrical connector and having at least one of a variety of fastener points for fastening said electrical connector to said receptacle, said chassis further having an electrically grounded cover plate for covering a predetermined portion of said chassis near said receptacle and connecting said chassis to an electrical ground, said EMI/RFI gasket comprising:

a gasket plate having a first side and a second side and comprising a flat, flexible, electrically-conductive material having sufficient surface area for adhering and electrically connecting to said cover plate while maintaining flexibility sufficient to move upon being placed over said receptacle promote electrical contact among said receptacle, said connector, and said gasket plate;

adhering means for adhering said gasket plate to said cover plate, said adhering means being positioned on both said first side and said second side and having a removable covering for selectively exposing said adhering means on said first side or said second side for adhering said gasket plate to said cover plate;

a receiving slot within said gasket plate for receiving said receptacle and engaging said fastener point, said receiving slot being symmetrical about a longitudinal axis and a latitudinal axis of said gasket plate; and a plurality of deflected teeth formed from said gasket plate and positioned around a predetermined portion of said receiving slot, said plurality of deflected teeth being deflected from said gasket plate for contacting said connector at points separated by not greater than a predetermined distance to maintain an electrical ground connection between said cover plate and said connector, said predetermined distance being determined partially by estimated wavelengths of said EMI radiation and said RFI radiation.

6. An electronic system chassis EMI/RFI radiation isolation method for prohibiting communication of EMI and RFI radiation through an electronic system chassis, said chassis having connector receiving means for receiving connector and having at least one fastener means for fastening said signal connection means to said connector receiving means, said electronic system chassis further having an electrically-grounded cover plate for covering a predetermined portion of said electronic system chassis near said connector receiving means and connecting said electronic system chassis to an electrical ground, said radiation isolation method comprising the steps of:

adhering and electrically connecting gasket means to said cover plate, said gasket means having sufficient flexibility to move upon being placed over said receptacle for promoting electrical contact among said connector receiving means said signal connection means, and said gasket means;

engaging said connector receiving means and said fastener means using an engaging means within said gasket means said engaging means being symmetrical about a longitudinal and a latitudinal axis of said gasket means;

contacting said signal connection means at points separated by not greater than a predetermined distance to maintain an electrical ground connection between said cover plate and said signal connection means using a plurality of contacting means deflected from said gasket means and positioned in association with said engaging means, said predetermined distance being determined partially by estimated wavelengths of said EMI radiation and said RFI radiation.

* * * * *